United States Patent
Kai et al.

(10) Patent No.: US 7,941,782 B2
(45) Date of Patent: May 10, 2011

(54) PATTERN LAYOUT OF INTEGRATED CIRCUIT

(75) Inventors: Yasunobu Kai, Yokohama (JP); Kazuo Hatakeyama, Tokyo (JP); Hidefumi Mukai, Kawasaki (JP); Hiromitsu Mashita, Kawasaki (JP); Koji Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 694 days.

(21) Appl. No.: 11/943,771

(22) Filed: Nov. 21, 2007

(65) Prior Publication Data
US 2008/0137421 A1 Jun. 12, 2008

(30) Foreign Application Priority Data
Nov. 22, 2006 (JP) .................................. 2006-315560

(51) Int. Cl.
*G06F 17/50* (2006.01)
(52) U.S. Cl. ........... 716/139; 716/55; 716/119; 716/132
(58) Field of Classification Search ..................... 716/55, 716/119, 132, 139
See application file for complete search history.

(56) References Cited

U.S. PATENT DOCUMENTS
7,716,617 B2 * 5/2010 Mashita et al. .................... 716/9

FOREIGN PATENT DOCUMENTS
JP 2006-293081 10/2006
* cited by examiner

*Primary Examiner* — Thuan Do
(74) *Attorney, Agent, or Firm* — Finnegan, Henderson, Farabow, Garrett & Dunner, L.L.P.

(57) ABSTRACT

In a pattern layout which includes a first device pattern having a uniformly repeated pattern group having first lines and first spaces formed parallel to one anther and uniformly arranged with constant width at a constant pitch and a non-uniformly repeated pattern group having first lines and first spaces non-uniformly arranged, and a second device pattern arranged adjacent to the end portion of the non-uniformly repeated pattern group in an arrangement direction thereof and having second lines and second spaces whose widths are larger than the widths of the first lines and first spaces of the non-uniformly repeated pattern group, at least part of the widths of the first lines and the first spaces of the non-uniformly repeated pattern group is made larger than the width of the first line or the width of the first space of the uniformly repeated pattern group.

11 Claims, 4 Drawing Sheets

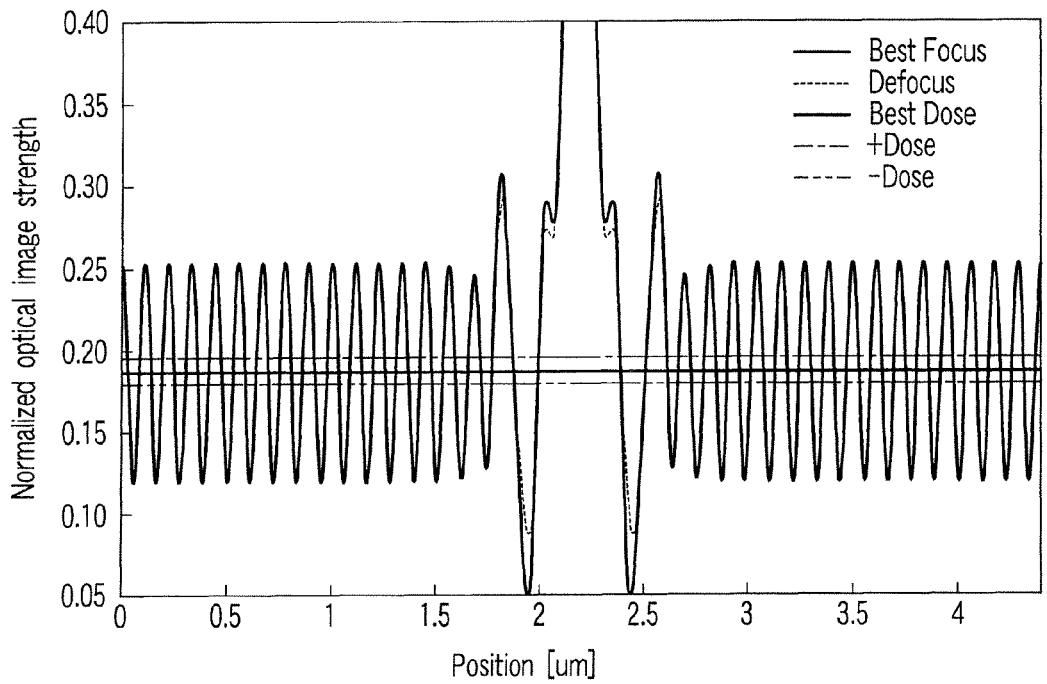
F I G. 5
| Patten | DOF [μm] |
|---|---|
| SG | 0.300 |
| SG-WL0 | 0.300 |
| WL0 | 0.280 |
| WL0-WL1 | 0.300 |
| WL1 | 0.300 |
| WL1-WL2 | 0.300 |
| WL2 | 0.300 |
| WL2-WL3 | 0.300 |
| WL3 | 0.300 |
| WL3-WL4 | 0.300 |
| COMMON | 0.257 |
F I G. 6

| | | |
|---|---|---|
| Adjusted dimensions | L1 | 102.68% |
| | S2 | 106.25% |
| | L2 | 106.25% |
| | S3 | 103.57% |
| | L3 | 103.57% |
| | S4 | 101.79% |
| | L4 | 101.79% |
| | S5 | 100.89% |
| Lines and spaces of minimum dimension | L5 | 100.00% |
| | S6 | 100.00% |
| | L6 | 100.00% |
| | S7 | 100.00% |
| | . | . |
| | . | . |
| | . | . |

PATTERN LAYOUT OF INTEGRATED CIRCUIT

CROSS-REFERENCE TO RELATED APPLICATIONS

This application is based upon and claims the benefit of priority from prior Japanese Patent Application No. 2006-315560, filed Nov. 22, 2006, the entire contents of which are incorporated herein by reference.

BACKGROUND OF THE INVENTION

1. Field of the Invention

This invention relates to a pattern layout used for manufacturing semiconductor devices and more particularly to a pattern layout of an integrated circuit having a uniformly repeated fine pattern of lines and spaces. Further, this invention relates to a correction method of an integrated circuit pattern layout and a NAND flash memory.

2. Description of the Related Art

In a NAND flash memory, a uniformly repeated pattern of lines and spaces drawn based on a design rule with the size approximately equal to the limit of the resolution is used to form control gate wires of the memory cell portion. The pattern of the integrated circuit is exposed by use of a photomask. In the exposure process for the memory cell portion by use of the photomask, there occurs a problem that the resolution of the boundary portion of the end portion of the memory cell portion is lowered although the resolution of the uniformly repeated area of the central portion of the memory cell portion is high.

In order to solve the above problem, a method is proposed to arrange an auxiliary pattern or dummy pattern to maintain the uniform repetitiveness on the photomask in addition to the original pattern (Jpn. Pat. Appln. KOKAI Publication No. 2006-293081). With the above method, for example, in order to preferably form a design pattern of the end portion of the memory cell portion on the wafer, the dimensions of the mask are corrected or the auxiliary pattern is arranged on the wafer to make the design pattern dimensions equal to the resist pattern dimensions.

However, even if this type of mask is used, a lowering in the optical contrast in a portion near the end portion of the memory cell portion of lines and spaces and a lowering in the lithography margin cannot be sufficiently suppressed at present.

Thus, conventionally, in the line and space pattern of the memory cell portion of the NAND flash memory or the like, there occurs a problem that the resolution of the end portion is lowered at the pattern exposure time and the lithography margin is lowered. Further, even when the auxiliary pattern or dummy pattern used to maintain the uniform repetitiveness is arranged on the exposure mask, it is difficult to attain sufficiently high resolution.

BRIEF SUMMARY OF THE INVENTION

According to a first aspect of this invention, there is provided a pattern layout of an integrated circuit which includes a first device pattern having a uniformly repeated pattern group having first lines and first spaces formed parallel to one anther and uniformly and repeatedly arranged with constant width at a pitch with a constant interval and a non-uniformly repeated pattern group having first lines and first spaces non-uniformly and repeatedly arranged in a portion adjacent to the uniformly repeated pattern group, and a second device pattern arranged adjacent to the end portion of the non-uniformly repeated pattern group in an arrangement direction thereof, arranged in parallel to the first device pattern and having second lines and second spaces whose widths are larger than the widths of the first lines and first spaces of the non-uniformly repeated pattern group, wherein at least part of the widths of the first lines and the first spaces of the non-uniformly repeated pattern group in the first device pattern is made larger than the width of the first line and the width of the first space of the uniformly repeated pattern group.

According to a second aspect of this invention, there is provided a correction method for an integrated circuit pattern layout which includes performing lithography simulation to expose a pattern on a sample by using a pattern layout of an integrated circuit having a first device pattern which has a uniformly repeated pattern group having first lines and first spaces formed parallel to one anther and uniformly and repeatedly arranged with constant width at a pitch with a constant interval and a non-uniformly repeated pattern group having first lines and first spaces non-uniformly and repeatedly arranged in a portion adjacent to the uniformly repeated pattern group, and a second device pattern arranged adjacent to the end portion of the non-uniformly repeated pattern group in an arrangement direction thereof, arranged in parallel to the first device pattern and having second lines and second spaces whose widths are larger than the widths of the first lines and first spaces of the non-uniformly repeated pattern group, and setting at least part of the widths of the first lines and the widths of the first spaces of the non-uniformly repeated pattern group in the first device pattern larger than the width of the first line and the width of the first space of the uniformly repeated pattern group to make a lithography margin maximum with respect to an exposure amount and focus variation based on the simulation result.

According to a third aspect of this invention, there is provided a NAND flash memory which includes a control gate pattern having a uniformly repeated pattern group having first lines and first spaces formed parallel to one anther and uniformly and repeatedly arranged with constant width at a pitch with a constant interval and a non-uniformly repeated pattern group having first lines and first spaces non-uniformly and repeatedly arranged in a portion adjacent to the uniformly repeated pattern group, and a selection gate pattern arranged adjacent to the end portion of the non-uniformly repeated pattern group in an arrangement direction thereof, arranged in parallel to the control gate pattern and having second lines and second spaces whose widths are respectively larger than the widths of the first lines and first spaces of the non-uniformly repeated pattern group, wherein at least part of the widths of the first lines and the first spaces of the non-uniformly repeated pattern group in the control gate pattern is made larger than the width of the first line and the width of the first space of the uniformly repeated pattern group.

BRIEF DESCRIPTION OF THE SEVERAL VIEWS OF THE DRAWING

FIG. 5 is a diagram showing the normalized optical image strength distribution when an exposure mask based on the layout pattern after correction is used.

FIG. 6 is a diagram showing DOF values of respective portions when the layout is corrected, for illustrating the effect of the first embodiment.

DETAILED DESCRIPTION OF THE INVENTION

There will now be described an embodiment of the present invention in detail with reference to the accompanying drawings.

First Embodiment

Figure 1:
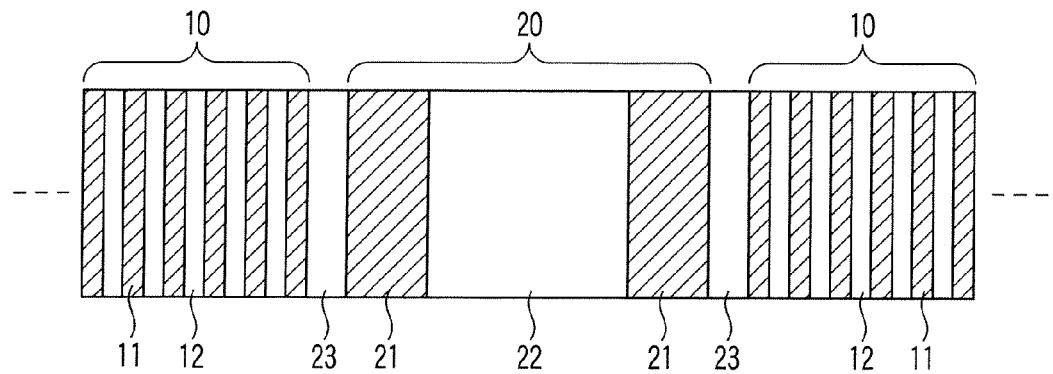
FIG. 1 is a plan view showing the layout pattern of an integrated circuit (before correction).

FIG. 1 is a plan view showing the layout pattern of an integrated circuit (before correction) according to a first embodiment of this invention and particularly shows the pattern of a gate portion of a NAND flash memory.

The NAND flash memory is obtained by serially connecting a plurality of nonvolatile memory cells having floating gates and control gates and connecting selection gates to the two end portions of the series-connected circuit. In the present embodiment, an attempt is made to enhance the resolution of a portion near the end portion of the memory cell portion of a line-and-space pattern used to form control gate wires of the NAND flash memory. In this example, the explanation is made by using a process of forming gate wires of the NAND flash memory based on the design rule of approximately 50 nm.

In FIG. 1, a reference symbol 10 denotes a first device pattern corresponding to the control gate wires of the NAND flash memory. In the first device pattern 10, first lines and first spaces formed parallel to one another are repeatedly arranged on a fixed pitch with a constant interval in a preset direction. A reference symbol 20 denotes a second device pattern corresponding to the selection gate wires of the NAND flash memory. The second device pattern 20 is arranged adjacent to the end portion of the first device pattern 10 in the arrangement direction thereof. In the second device pattern 20, second lines having a width greater than or equal to twice that of the first lines of the first device pattern 10 and second spaces having a width greater than or equal to twice that of the first spaces of the first device pattern 10 are non-uniformly and repeatedly arranged.

The first device pattern 10 is configured by control gate wires (word lines: first lines) 11 and spaces (first spaces) 12 arranged at a single repetitive interval. The outermost word line (the word line adjacent to the selection gate) among the word lines 11 can be made wider by approximately 10% than the other word lines.

The second device pattern 20 is configured by selection gate wires (second lines) 21, selection gate-selection gate space (second space) 22 and selection gate-word line spaces 23. The lines and spaces 21 to 23 configure a shunt portion and the following dimensions thereof are required from the viewpoint of the characteristics of the device and working process. That is, it is necessary to set the width of the selection gate-selection gate space 22 greater than or equal to seven times that of the word line 11, set the width of the selection gate wire 21 greater than or equal to twice that of the word line 11 and set the width of the selection gate-word line space 23 approximately equal to twice that of the word line 11.

Figure 2:
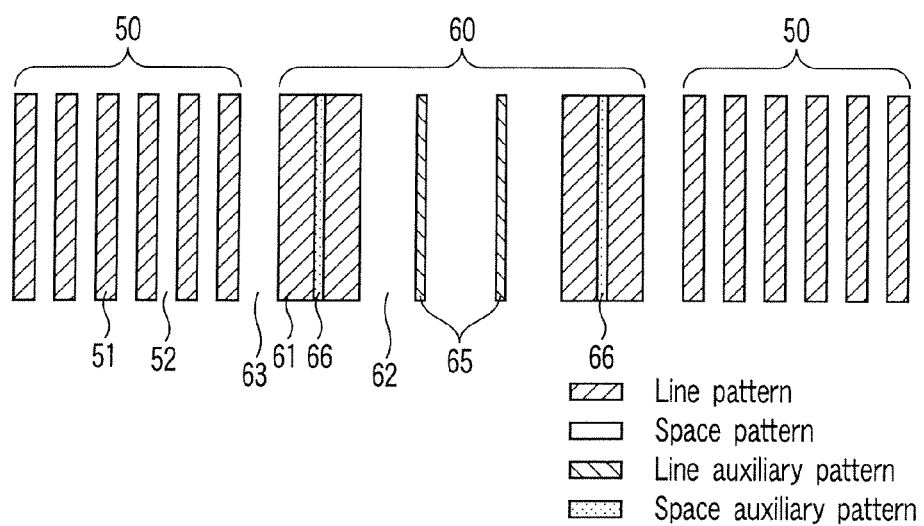
FIG. 2 is a plan view showing the pattern of an exposure mask used to form the pattern shown in FIG. 1.

In order to expose the thus formed pattern layout, an exposure mask having an auxiliary pattern is formed as shown in FIG. 2 to set the dimensions of the pattern layout (design pattern) equal to the dimensions of the resist patterns formed on the wafer.

In this case, a reference symbol 50 in FIG. 2 denotes an area corresponding to the first device pattern 10 and a reference symbol 60 denotes an area corresponding to the second device pattern 20. In the area 50, a line pattern 51 having the transmittance of 6% and the phase of 180 degrees to form the control gates 11 and a space pattern 52 having the light transmittance of 100% and the phase of 0 degree to form the spaces 12 are provided.

In the area 60, a line pattern 61 having the transmittance of 6% and the phase of 180 degrees to form the selection gate lines 21, a space pattern 62 having the light transmittance of 100% and the phase of 0 degree to form the selection gate-selection gate space 22 and a space pattern 63 having the light transmittance of 100% and the phase of 0 degree to form the selection gate-word line spaces 23 are provided. In the space pattern 63, a line auxiliary pattern 65 having the light transmittance of 6% and the phase of 180 degrees is provided. Further, in the line pattern 61, a space auxiliary pattern 66 having the light transmittance of 100% and the phase of 0 degree is provided.

However, even if a pattern is exposed on the wafer by using the exposure mask as shown in FIG. 2, at present, a lowering in the optical contrast in a portion near the end portion of the memory cell portion having lines and spaces and a lowering in the lithography margin cannot be sufficiently suppressed in the end portion of the first device pattern 10.

Figure 3:
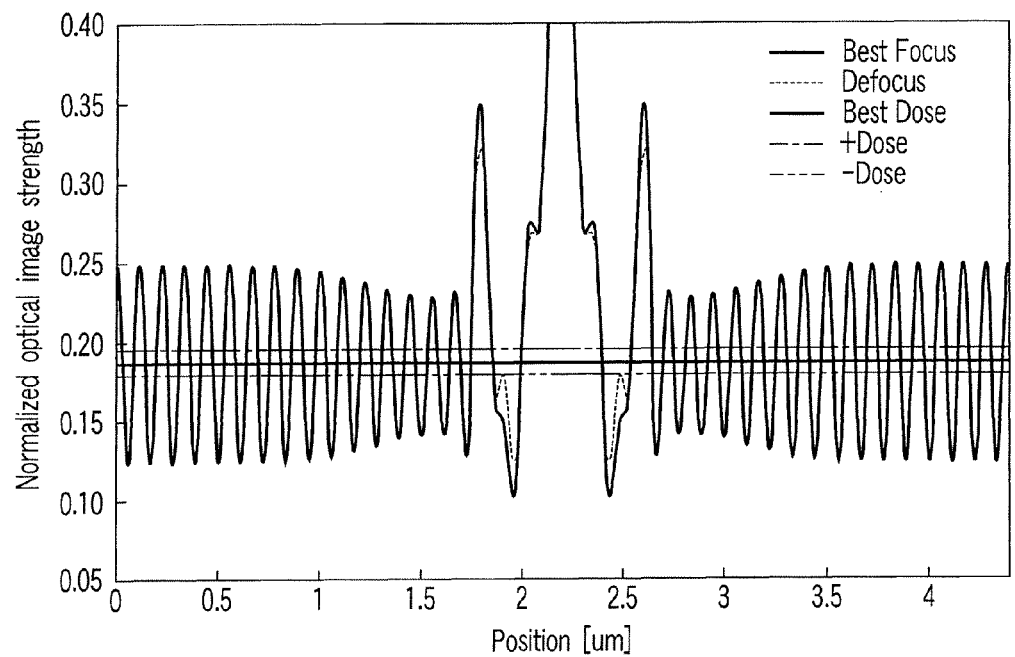
FIG. 3 is a diagram showing the normalized optical image strength distribution when an exposure mask based on the layout pattern before correction is used.

FIG. 3 is a diagram showing the normalized optical image strength distribution on the wafer when an exposure process is performed by use of the exposure mask of FIG. 2. The abscissa in FIG. 3 indicates a position on the wafer and the ordinate indicates the normalized optical image strength. As is clearly understood from FIG. 3, the peak value of the image strength in the portion near the end portion of the memory cell portion having lines and spaces becomes small. This is a factor of causing the optical contrast in a portion near the end portion of the memory cell portion having lines and spaces and the lithography margin to be lowered.

Figure 4:
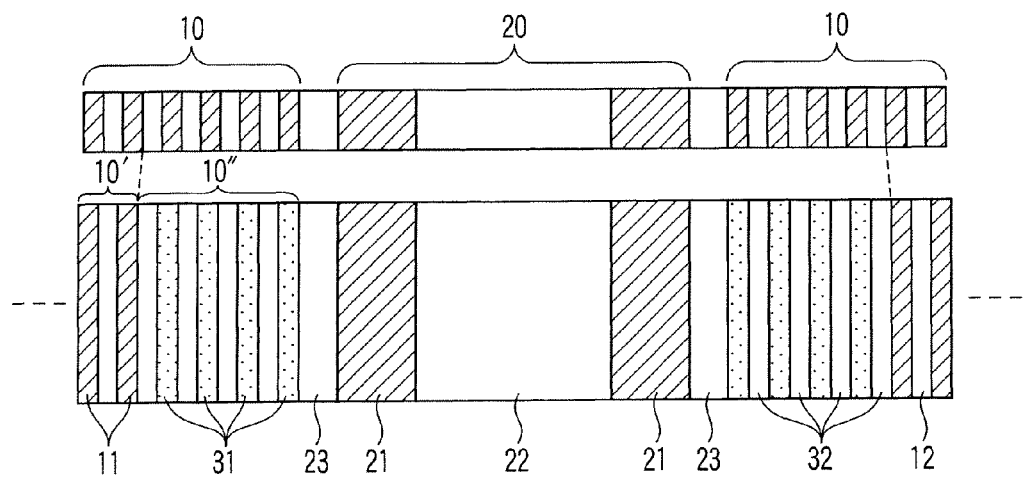
FIG. 4 is a plan view showing the layout pattern of an integrated circuit (after correction) according to a first embodiment of this invention.

Therefore, in the present embodiment, the layout pattern of FIG. 1 to be formed on the wafer is corrected to form a layout pattern as shown in FIG. 4. FIG. 4 is a plan view showing the layout pattern of an integrated circuit (after correction) according to the first embodiment of this invention.

It is featured that the dimensions of word lines 31 and the word line-word line spaces 32 of FIG. 4 in the single repetitive interval of lines and spaces of approximately 50 nm of the word lines 11 and spaces 12 of FIG. 1 are corrected and increased in comparison with the interval described before. Specifically, the widths of the word lines 31 and spaces 32 in the area of the end portion of the first device pattern 10 are made larger than the fixed pitch.

Thus, the first device pattern 10 is formed to have a uniformly repeated pattern group 10' in which first lines (word lines) 11 and second spaces 12 formed parallel to one anther are uniformly and repeatedly arranged with constant width on a fixed pitch with a constant interval and a non-uniformly repeated pattern group 10" in which first lines (word lines) 31 and first spaces 32 are non-uniformly and repeatedly arranged in a portion adjacent to the uniformly repeated pattern group 10'. Then, the width of the first line 31 of the non-uniformly repeated pattern group 10" is made larger than the width of the first line 11 of the uniformly repeated pattern group 10' and the width of the first space 32 of the non-uniformly repeated pattern group 10" is made larger than the width of the first space 12 of the uniformly repeated pattern group 10'. Further, the width of the second line (selection gate wiring) 21 of the second device pattern 20 is made larger than the width of the first line 31 of the non-uniformly repeated pattern group 10" and the width of the second space (selection gate-selection gate space) 22 is made larger than the width of the first space 32 of the non-uniformly repeated pattern group 10".

The amount by which the widths of the word line 31 and space 32 are increased can be made uniform for each pattern or may be made different for each pattern. Specifically, since the peak value of the image strength becomes small in the end portion of the first device pattern 10 as shown in FIG. 3, the line width and space width of the pattern in the end portion are increased so that the peak value can be increased to set the peak value of the image strength in the first device pattern 10 closer to a constant value even in the end portion.

More specifically, simulation is made based on FIG. 3, the peak value of the image strength which becomes small in the end portion of the first device pattern 10 is increased and the line width and space width in the end portion (in the non-uniformly repeated pattern group area) are increased so that the peak value of the image strength in the first device pattern 10 can be set closer to a constant value even in the end portion.

An exposure mask as shown in FIG. 2 is formed for the layout pattern shown in FIG. 4 and the pattern exposure process is performed by using the mask. An example of the normalized optical image strength of the line-and-space pattern, respective dimensions and DOF values obtained by calculation based on simulation is shown in FIGS. 5 and 6. FIG. 5 shows the normalized optical image strength corrected according to a design, the abscissa indicates a position and the ordinate indicates the normalized optical image strength. FIG. 6 shows DOF values corrected according to the layout and the DOF values for the respective patterns are shown. A reference symbol SG in FIG. 6 denotes the selection gate wire, WL0 to WL4 denote word lines and COMMON denotes a common margin.

It is understood from FIG. 5 that the optical image strength of a portion near the end portion of the uniformly repeated lines and spaces is enhanced and the resolution thereof is enhanced. Further, it is understood from FIG. 6 that the DOF value for any one of the patterns is larger than 0.15 μm and the sufficiently high resolution can be attained. Further, according to the experiment by the inventor et al. of this application, it is confirmed that the lithography margin of the first device pattern 10 in an area (non-uniformly repeated pattern group area) adjacent to the second device pattern 20 is greater than or equal to 50% of the lithography margin in an area sufficiently far apart from the second device pattern 20. As a result, a pattern as shown in FIG. 4 can be formed on a resist on the wafer with high resolution.

As indicated by the above result, in the present embodiment, a lowering in the contrast of an optical image of a portion near the end portion of the memory cell portion can be suppressed and DOF values required for production can be stably acquired. In the dimensions of the pattern formed on the wafer, the widths of the lines and spaces are slightly increased in the end portion of the first device pattern 10, but the other portions are substantially the same as those of the pattern shown in FIG. 1. The amount by which the widths of the lines and spaces are increased in the end portion is extremely small as a whole and does not substantially cause a problem from the viewpoint of the integration density.

Figures 7A, 7B:
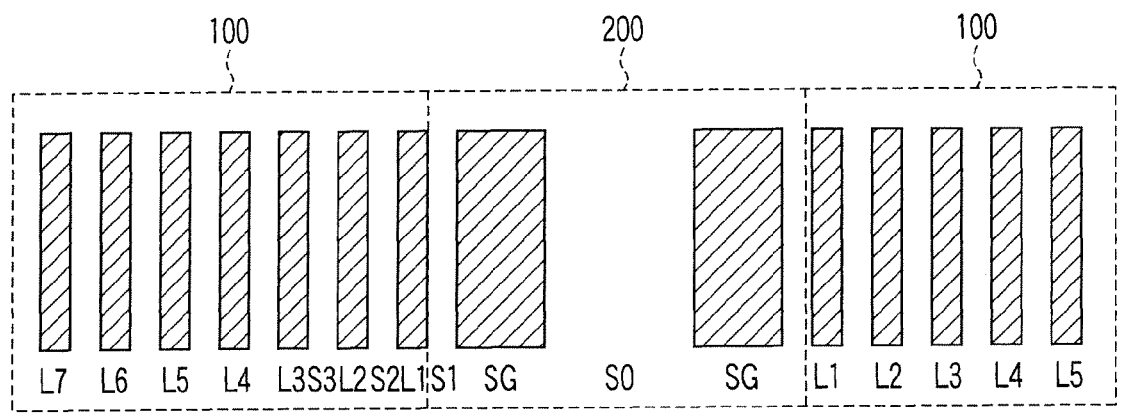
FIGS. 7A and 7B are a view and diagram showing an example in which the dimensions of the respective patterns are actually adjusted based on the first embodiment.

FIGS. 7A and 7B are a view and diagram showing an example in which the dimensions of respective patterns are actually adjusted based on the present embodiment. FIG. 7A corresponds to FIG. 1 and separately shows first-type shapes 100 of lines and spaces relating to word lines and a second-type shape 200 relating to selection gate wires. FIG. 7B shows an example in which each pattern dimension of the first-type shape is adjusted. In FIG. 7B, the values are expressed by the percentage with respect to the minimum dimension. L1 to L6, . . . indicate word lines and S2 to S7, . . . indicate spaces.

The dimensions of the word lines L1 to L4 and spaces S2 to S5 in a portion near the end portion, that is, near the selection gate wire SG in the first-type shape 100 are increased by several %. When the dimensions are increased, the increasing rate may be determined by simulation based on the strength distribution as shown in FIG. 3. In the second-type shape 200, since the adjustment thereof does not influence the resolution as in the case of the adjustment of the first-type shape 100, it is not necessary to adjust the second-type shape 200. However, the resolution can be further enhanced by adjusting the second-type shape 200 in addition to the adjustment of the first-type shape 100.

Thus, according to the present embodiment, the resolution of the line-and-space pattern of a portion near the end portion of the memory cell portion can be enhanced by lowering the repetition rate of the line-and-space pattern in a nearby portion with respect to the end portion of the memory cell portion arranged in the pattern of lines and spaces formed at the single repetitive interval in the NAND flash memory. That is, the resolution of the end portion of the uniformly repeated lines and spaces of the memory cell or the like can be enhanced and, as a result, a variation in the dimensions at the time of variation in the exposure amount and focus can be suppressed and the lithography margin can be enhanced.

Modification

This invention is not limited to the above embodiment. In the above embodiment, a case wherein the NAND flash memory is taken as an example is explained, but if a pattern having uniformly repeated lines and spaces is used, the pattern is not limited to the NAND flash memory and can be applied to various types of integrated circuit patterns.

Further, in an area of the first device pattern which is adjacent to the second device pattern, the amounts by which the widths of the lines and spaces are increased are not limited to the values described in the present embodiment and can be adequately changed according to the specification. Further, an increased amount can be set to a constant value for each pattern or may be varied for each pattern so that the DOF value will become maximum.

Further, as the exposure mask used to form the pattern layout formed according to this invention on the wafer, an exposure mask having an auxiliary pattern or dummy pattern as shown in FIG. 2 can be used or an exposure mask having only an original pattern can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A pattern layout of an integrated circuit comprising:
a first device pattern having
a uniformly repeated pattern group having first lines and first spaces formed in a direction parallel to one another and uniformly and repeatedly arranged with constant width at a pitch with a constant interval and a non-uniformly repeated pattern group having first lines and first spaces non-uniformly and repeatedly arranged, the non-uniformly repeated pattern group being positioned adjacent to an end portion of the uniformly repeated pattern group and in the parallel direction, and a second device pattern arranged adjacent to the non-uniformly repeated pattern group and opposite to the uniformly repeated pattern group with respect to the non-uniformly repeated pattern group, arranged in parallel to the first device pattern and having second lines and second spaces whose widths are larger than widths of the first lines and first spaces of the non-uniformly repeated pattern group, wherein at least part of the widths of the first lines and the first spaces of the non-uniformly repeated pattern group in the first device pattern is made larger than one of the width of the first line and the width of the first space of the uniformly repeated pattern group.

2. The pattern layout of the integrated circuit according to claim 1, wherein the width of the second line is not smaller than twice the width of the first line of the uniformly repeated pattern group and the width of the second space is not smaller than twice the width of the first space of the uniformly repeated pattern group.

3. The pattern layout of the integrated circuit according to claim 1, wherein at least part of the width of the first line and the width of the first space of the uniformly repeated pattern group is increased to set equal optical image strengths in the non-uniformly repeated pattern group and uniformly repeated pattern group.

4. The pattern layout of the integrated circuit according to claim 1, wherein constant width of the uniformly repeated pattern group of the first device pattern is minimum dimension of lithography and the first lines of the non-uniformly repeated pattern group are arranged on both ends of the first device pattern.

5. The pattern layout of the integrated circuit according to claim 4, wherein the second lines and second spaces of the second device pattern have dimensions not smaller than twice the minimum dimension and the second spaces are arranged on both ends thereof.

6. The pattern layout of the integrated circuit according to claim 1, wherein the first device pattern corresponds to control gate wires of a memory cell portion of a NAND flash memory and the second device pattern corresponds to selection gate wires of the flash memory.

7. A NAND flash memory comprising:

a control gate pattern having a uniformly repeated pattern group having first lines and first spaces formed in a direction parallel to one another and uniformly and repeatedly arranged with constant width at a pitch with a constant interval and a non-uniformly repeated pattern group having first lines and first spaces non-uniformly and repeatedly arranged, the non-uniformly repeated pattern group being positioned adjacent to an end portion of the uniformly repeated pattern group and in the parallel direction, and a selection gate pattern arranged adjacent to the non-uniformly repeated pattern group and opposite to the uniformly repeated pattern group with respect to the non-uniformly repeated pattern group, arranged in parallel to the control gate pattern and having second lines and second spaces whose widths are larger than widths of the first lines and first spaces of the non-uniformly repeated pattern group, wherein at least part of the widths of the first lines and the first spaces of the non-uniformly repeated pattern group in the control gate pattern is made larger than one of the width of the first line and the width of the first space of the uniformly repeated pattern group.

8. The NAND flash memory according to claim 7, wherein the width of the second line is not smaller than twice the width of the first line of the uniformly repeated pattern group and the width of the second space is not smaller than twice the width of the first space of the uniformly repeated pattern group.

9. The NAND flash memory according to claim 7, wherein at least part of the width of the first line and the width of the first space of the non-uniformly repeated pattern group is increased to set equal optical image strengths in the non-uniformly repeated pattern group and uniformly repeated pattern group.

10. The NAND flash memory according to claim 7, wherein constant width in the uniformly repeated pattern group of the control gate pattern is minimum dimension of lithography and the first lines of the non-uniformly repeated pattern group are arranged on both ends of the control gate pattern.

11. The NAND flash memory according to claim 10, wherein the second lines and second spaces of the selection gate pattern have dimensions not smaller than twice the minimum dimension and the second spaces are arranged on both ends thereof.

* * * * *